United States Patent
Yu et al.

(10) Patent No.: US 11,757,413 B2
(45) Date of Patent: Sep. 12, 2023

(54) HYBRID MODE BASED AUDIO PROCESSING METHOD AND APPARATUS THEREFOR

(71) Applicant: DREAMUS COMPANY, Seoul (KR)

(72) Inventors: Seung Ho Yu, Incheon (KR); Ji Heon Ahn, Yongin (KR)

(73) Assignee: DREAMUS COMPANY, Seoul (KR)

(*) Notice: Subject to any disclaimer, the term of this patent is extended or adjusted under 35 U.S.C. 154(b) by 0 days.

(21) Appl. No.: 17/685,120

(22) Filed: Mar. 2, 2022

(65) Prior Publication Data

US 2022/0337195 A1    Oct. 20, 2022

(30) Foreign Application Priority Data

Apr. 16, 2021    (KR) .................. 10-2021-0049982

(51) Int. Cl.
    *H03F 1/02*    (2006.01)
    *H03M 1/16*    (2006.01)

(52) U.S. Cl.
    CPC ............ *H03F 1/0222* (2013.01); *H03M 1/16* (2013.01); *H03F 2200/03* (2013.01)

(58) Field of Classification Search
    CPC .. H03F 1/0222; H03F 1/0266; H03F 2200/03; H03M 1/16
    See application file for complete search history.

(56) References Cited

U.S. PATENT DOCUMENTS

| 6,347,185 B1* | 2/2002 | Takahashi ............ G11B 27/329 386/277 |
| 2003/0100349 A1* | 5/2003 | Cho .................... H04M 1/6016 455/567 |

FOREIGN PATENT DOCUMENTS

| JP | 2002-095083 A | 3/2002 |
| JP | 2002095083 A * | 3/2002 |
| KR | 20040103374 A | 12/2004 |
| KR | 20080012820 A | 2/2008 |
| KR | 2015-0115309 A | 10/2015 |

* cited by examiner

*Primary Examiner* — Patrick C Chen

(57) ABSTRACT

Disclosed are a hybrid mode based audio processing method and an apparatus therefor. A hybrid mode based audio processing apparatus according to an exemplary embodiment of the present disclosure includes a signal converting unit which converts a digital signal of an input sound source into an analog signal; a mode controller which analyzes the input sound source, sets an amplification mode according to the analysis result, and generates an amplification control signal to control the amplification mode; an amplifying unit which amplifies the analog signal in the amplification mode set based on the amplification control signal; and an audio output unit which outputs an audio corresponding to the amplified analog signal.

11 Claims, 5 Drawing Sheets

HYBRID MODE BASED AUDIO PROCESSING METHOD AND APPARATUS THEREFOR

CROSS-REFERENCE TO RELATED APPLICATIONS

This application claims priority to and the benefit of Korean Patent Application No. 10-2021-0049982 filed in the Korean Intellectual Property Office on Apr. 16, 2021, the entire contents of which are incorporated herein by reference.

TECHNICAL FIELD

The present disclosure relates to a hybrid mode based audio processing method by applying at least one amplification mode and an apparatus therefor.

BACKGROUND ART

The contents described in this section merely provide background information on the exemplary embodiment of the present disclosure, but do not constitute the related art. In the modern society, in accordance with the improvement of an audio output technique, various studies to improve a texture of the audio output are being conducted.

There are various components which affect the texture of the audio output. Among them, an operation of amplifying a signal especially affects an audio output texture.

However, generally, an amplifying method for audio output is provided only by one method using one device. Specifically, an amplifying method using a vacuum tube and an amplifying method using operational amplification use separate audio output products for individual methods, respectively.

A technique for such a single amplifying method is disclosed in Korean Registered Patent No. 10-1868415.

Therefore, a technique for improving a texture of an audio by mixing different amplifying methods is necessary.

SUMMARY

A main object of the present disclosure is to provide a hybrid mode based audio processing method which outputs an audio using at least one amplification mode among different amplification modes and an apparatus therefor.

According to an aspect of the present disclosure, in order to achieve the above-described objects, a hybrid mode based audio processing apparatus includes a signal converting unit which converts a digital signal of an input sound source into an analog signal; a mode controller which analyzes the input sound source, sets an amplification mode according to the analysis result, and generates an amplification control signal to control the amplification mode; an amplifying unit which amplifies the analog signal in the amplification mode set based on the amplification control signal; and an audio output unit which outputs an audio corresponding to the amplified analog signal.

Further, according to another aspect of the present disclosure, in order to achieve the above-described objects, a hybrid mode based audio processing method includes a signal converting step of converting a digital signal of an input sound source into an analog signal; a mode control step of analyzing the input sound source, setting an amplification mode according to the analysis result, and generating an amplification control signal to control the amplification mode; an amplifying step of amplifying the analog signal in at least mode based on the amplification control signal; and an audio output step of outputting the amplified audio.

As described above, according to the present disclosure, one apparatus outputs an audio to which a plurality of amplification modes is applied.

Further, according to the present disclosure, different amplification modes are applied depending on a sound source to output an optimal audio.

Further, according to the present disclosure, advantages of different amplification modes are combined to output an optimal audio.

Further, according to the present disclosure, a power for each of different amplification modes is controlled to minimize a consumption current for an audio output.

DETAILED DESCRIPTION OF THE EMBODIMENT

Hereinafter, exemplary embodiments of the present disclosure will be described in detail with reference to the accompanying drawings. In the description of the present disclosure, if it is considered that the specific description of related known configuration or function may cloud the gist of the present disclosure, the detailed description will be omitted. Further, hereinafter, exemplary embodiments of the present disclosure will be described. However, it should be understood that the technical spirit of the invention is not restricted or limited to the specific embodiments, but may be changed or modified in various ways by those skilled in the art to be carried out. Hereinafter, a hybrid mode based audio processing method and an apparatus therefor proposed by the present disclosure will be described in detail with reference to drawings.

Figure 1:
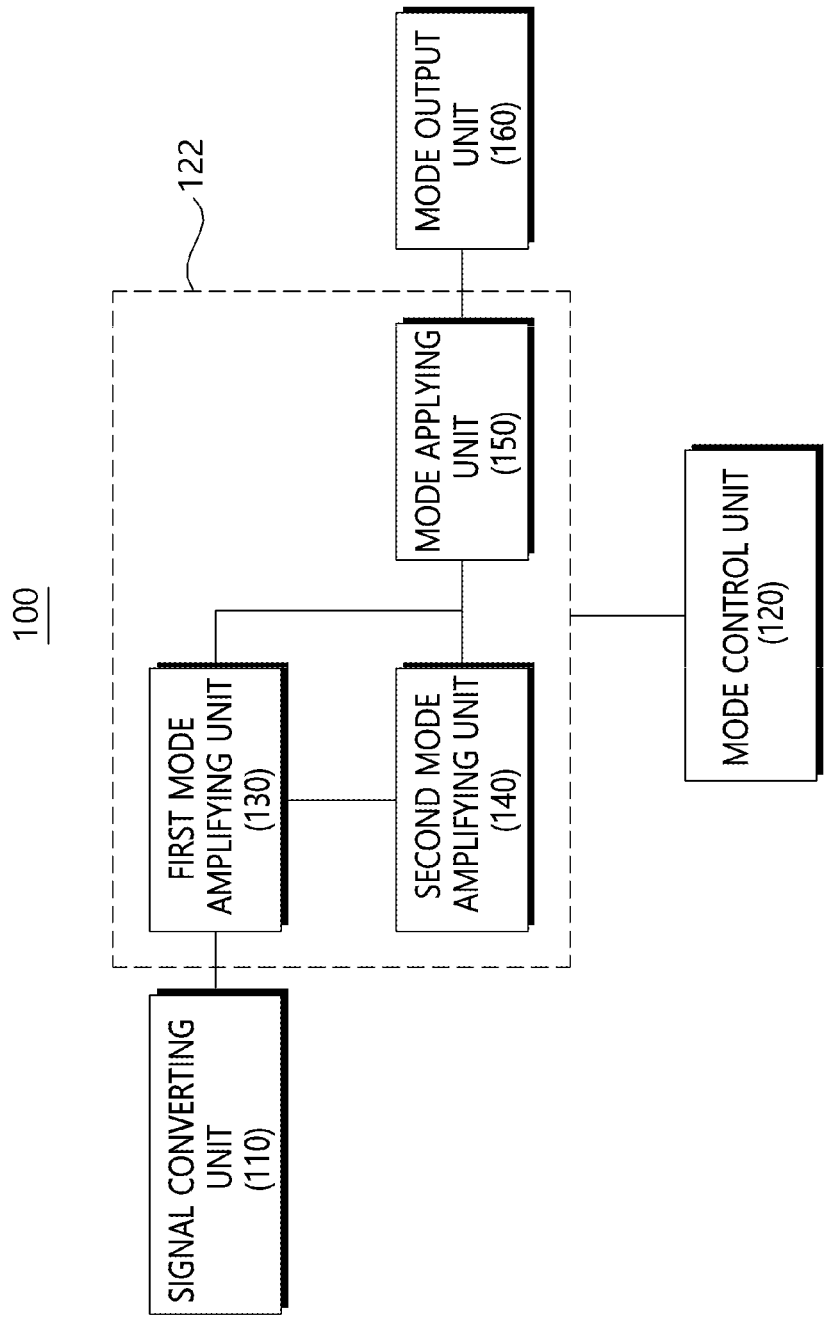
FIG. 1 is a block diagram schematically illustrating a hybrid mode based audio processing apparatus according to an exemplary embodiment of the present disclosure.

FIG. 1 is a block diagram schematically illustrating a hybrid mode based audio processing apparatus according to an exemplary embodiment of the present disclosure.

A hybrid mode based audio processing apparatus 100 according to the present exemplary embodiment includes a signal converting unit 110, a mode control unit 120, an amplifying unit 122, and an audio output unit 160. The audio processing apparatus 100 of FIG. 1 is an example so that all blocks illustrated in FIG. 1 are not essential components and in the other exemplary embodiment, some blocks included in the audio processing apparatus 100 may be added, modified, or omitted.

The audio processing apparatus 100 amplifies an input sound source using at least one of a first amplification mode and a second amplification mode and outputs an amplified audio. Hereinafter, components included in the audio processing apparatus 100 will be described.

The signal converting unit 110 receives a sound source and converts a digital signal of the input sound source into an analog signal. The signal converting unit 110 is desirably a digital analog converter (DAC).

The mode control unit 120 analyzes the input sound source, sets an amplification mode according to the analysis result, and generates an amplification control signal to control the set amplification mode. The mode control unit 120 transmits the generated amplification control signal to the amplifying unit 122 to control an amplifying operation of the analog signal based on a predetermined amplification mode.

The mode control unit 120 sets one of a first amplification mode, a second amplification mode, and a hybrid amplification mode based on the analysis result on the input sound source. Here, the analysis of the input sound source refers to an operation of identifying field information, genre information, sound source data information (composition information, lyric information, and album information), and attribute information (length and a file format).

In the mode control unit 120, the first amplification mode refers to a tube amp based amplification mode and the second amplification mode refers to an op-amp based amplification mode. Further, the hybrid amplification mode refers to an amplification mode in which the first amplification mode and the second amplification mode are mixed.

The mode control unit 120 sets one of the first amplification mode, the second amplification mode, and the hybrid amplification mode corresponding to the analysis result of a type of the input sound source or a specific sound source which is previously set by a user.

When the hybrid amplification mode is set, the mode control unit 120 sets a ratio of the first amplification mode and the second amplification mode and generates an amplification control signal to control an amplification mode according to the set ratio.

The mode control unit 120 may generate an amplification control signal to control a power according to the ratio of the first amplification mode and the second amplification mode.

The mode control unit 120 selects candidate amplification modes matching the analysis result of the input sound source and sets one of the selected candidate amplification modes, that is, one of the first amplification mode, the second amplification mode, and the hybrid amplification mode.

When there is a plurality of candidate amplification modes matching the genre information of the analysis result of the input sound source, the mode controller 120 selects a specific amplification mode based on a performance condition of the candidate amplification mode or a predetermined priority condition.

For example, when there is a plurality of candidate amplification modes matching the genre information, the mode control unit 120 calculates a first score by identifying a performance condition (for example, a previously evaluated amplification performance) for each candidate amplification mode and calculates a second score based on a selection frequency (a selection frequency based on the past selecting history) for each candidate amplification mode and then adds the first score and the second score to calculate the sum of the candidate amplification modes and select a candidate amplification mode having the highest sum, among the candidate amplification modes, as a specific amplification mode. Here, the specific amplification mode may be one of the first amplification mode, the second amplification mode, and the hybrid amplification mode. In the case of the hybrid amplification mode, a ratio of the first amplification mode and the second amplification mode may be determined based on the summed value of the candidate amplification modes.

In the meantime, the mode control unit 120 may select the specific amplification mode by additionally applying a priority. For example, when a priority for each of the candidate amplification modes is set in advance, the mode control unit 120 checks a weight set for each priority, multiplies the confirmed weight and the summed value of the candidate amplification modes obtained by adding the first score and the second score to calculate a final calculated value of each of the candidate amplification modes, and select a candidate amplification mode having the highest final calculated value among the candidate amplification modes as a specific amplification mode.

The amplifying unit 122 amplifies the analog signal in an amplification mode set based on the amplification control signal. The amplifying unit 122 according to the exemplary embodiment includes a first mode amplifying unit 130, a second mode amplifying unit 140, and a mode applying unit 150.

The first mode amplifying unit 130 amplifies an analog signal of an input sound source in a tube amp based first amplification mode based on the amplification control signal to output a first amplified signal.

The second mode amplifying unit 140 amplifies an analog signal of the input sound source in an op-amp based second amplification mode based on the amplification control signal to output a second amplified signal.

The mode applying unit 150 generates and outputs a final amplified signal using at least one of the first amplified signal and the second amplified signal.

When the set amplification mode is the first amplification mode, the mode applying unit 150 generates a final amplified signal using only the first amplified signal acquired by the switching control according to the amplification control signal.

In the meantime, when the set amplification mode is the second amplification mode, the mode applying unit 150 generates a final amplified signal using only the second amplified signal acquired by the switching control according to the amplification control signal.

In the meantime, when the set amplification mode is the hybrid amplification mode, the mode applying unit 150 generates a final amplified signal using the first amplified signal and the second amplified signal acquired by the switching control according to the amplification control signal.

The audio output unit 160 outputs an audio corresponding to the analog signal amplified based on the set amplification mode. The audio output unit 160 may be implemented by a module or a device which outputs an audio, such as a speaker.

Figure 2:
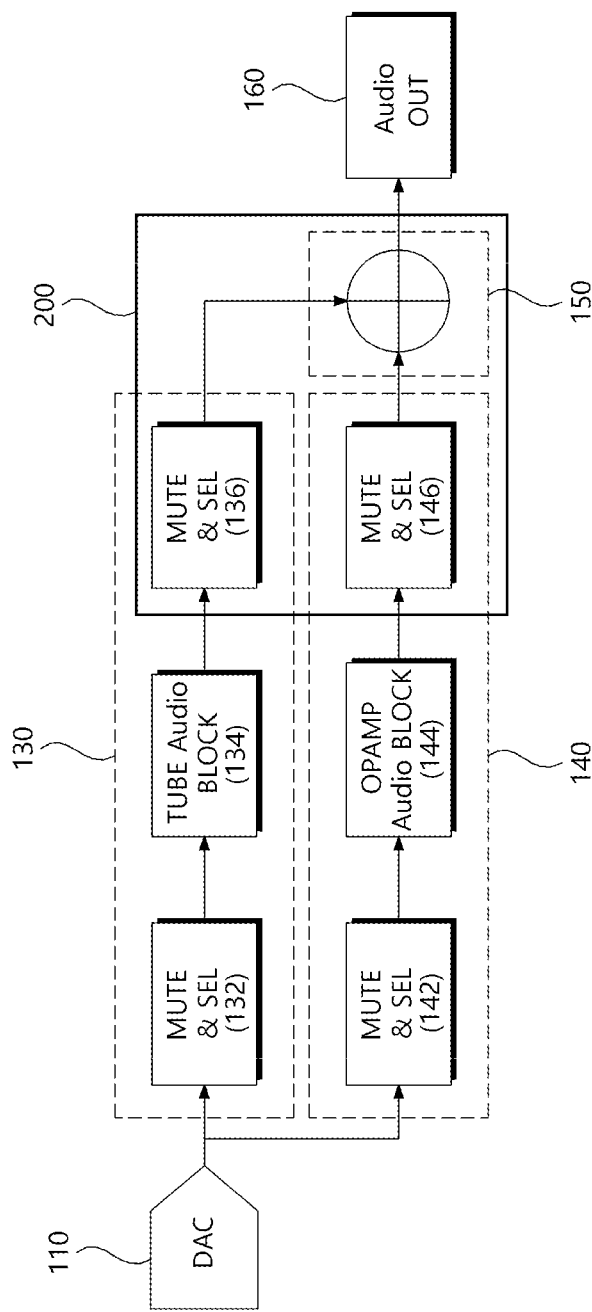
FIGS. 2 and 3 are block diagrams schematically illustrating a configuration of an amplifying unit of an audio processing apparatus according to an exemplary embodiment of the present disclosure.
Figure 3:
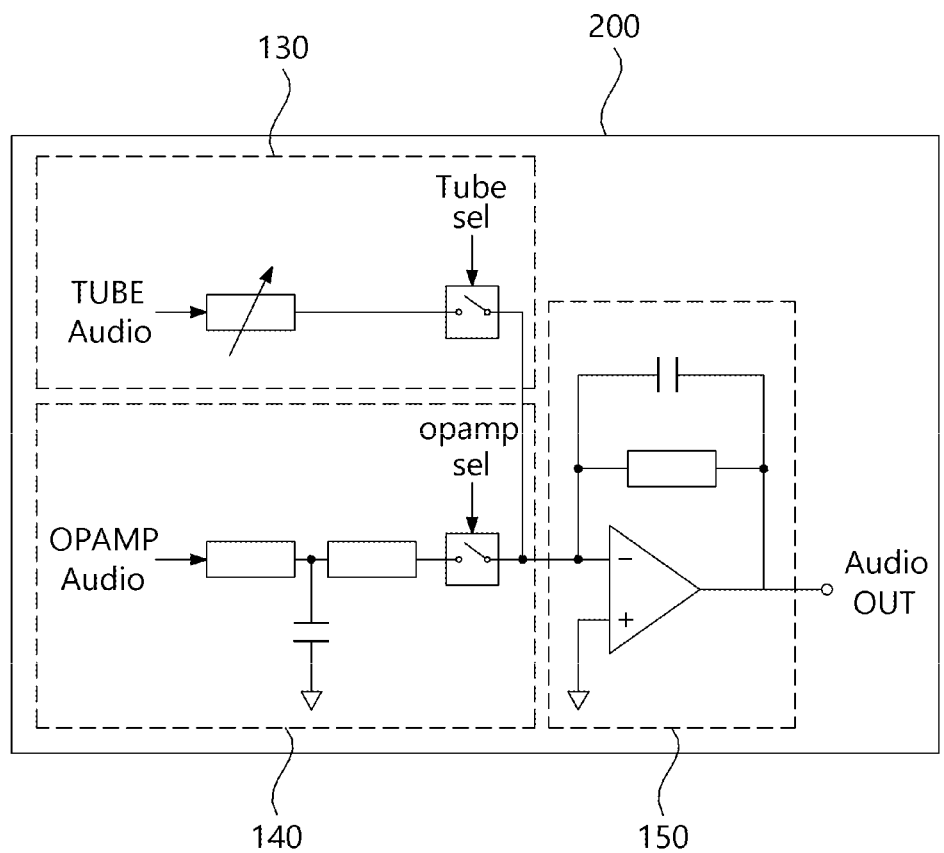

FIGS. 2 and 3 are block diagrams schematically illustrating a configuration of an amplifying unit of an audio processing apparatus according to an exemplary embodiment of the present disclosure.

The first mode amplifying unit 130 includes a first mute cell which mutes the analog signal at a predetermined timing, a first audio block which amplifies the muted analog signal in the tube amp based first amplification mode, and a second mute cell which mutes the amplified analog signal at a predetermined timing.

The second mode amplifying unit 140 includes a third mute cell which mutes the analog signal at a predetermined timing, a second audio block which amplifies the muted analog signal in the op-amp based second amplification mode, and a fourth mute cell which mutes the amplified analog signal at a predetermined timing.

When the amplification mode is the first amplification mode, the mode applying unit 150 generates a final amplified signal using only the first amplified signal acquired by the switching control according to the amplification control signal.

In the meantime, when the amplification mode is the second amplification mode, the mode applying unit 150 generates a final amplified signal using only the second amplified signal acquired by the switching control according to the amplification control signal.

In the meantime, when the amplification mode is the hybrid amplification mode, the mode applying unit 150 generates a final amplified signal using the first amplified signal and the second amplified signal acquired by the switching control according to the amplification control signal.

FIG. 3 illustrates a mode applying circuit 200 showing some components of the first mode amplifying unit 130 and the second mode amplifying unit 140 and a configuration of the mode applying unit 150.

In the mode applying circuit 200, the first mode amplifying unit 130 mutes the analog signal which is amplified in the first amplification mode using a variable resistor. The first mode amplifying unit 130 may adjust a texture of the first amplified signal according to the first amplification mode by adjusting a variable resistor based on the amplification control signal.

In the mode applying circuit 200, the first mode amplifying unit 130 includes a first amplification mode switch between the variable resistor and the mode applying unit 150. When the set amplification mode is a first amplification mode or a hybrid amplification mode, the first amplification mode switch is controlled to be an ON state. In the meantime, when the set amplification mode is a second amplification mode, the first amplification mode switch is controlled to be an OFF state.

In the mode applying circuit 200, the second mode amplifying unit 140 mutes the analog signal which is amplified in the second amplification mode using two fixed resistors and a capacitor connected between two resistors.

In the mode applying circuit 200, the second mode amplifying unit 140 includes a second amplification mode switch between the fixed resistor and the mode applying unit 150. When the set amplification mode is a second amplification mode or a hybrid amplification mode, the second amplification mode switch is controlled to be an ON state. In the meantime, when the set amplification mode is a first amplification mode, the second amplification mode switch is controlled to be an OFF state.

In the mode applying circuit 200, the mode applying unit 150 is configured to include an operational amplifier, a capacitor, and a fixed resistor.

In the mode applying circuit 200, outputs of the first mode amplifying unit 130 and the second mode amplifying unit 140 are connected to a (−) input terminal of the operational amplifier of the mode applying unit 150 and a (+) input terminal of the operational amplifier is connected to the ground GND.

In the mode applying unit 150, the capacitor and the fixed resistor are connected to the operational amplifier in parallel and the output terminal of the operational amplifier is connected to the audio output unit 160.

Figure 4:
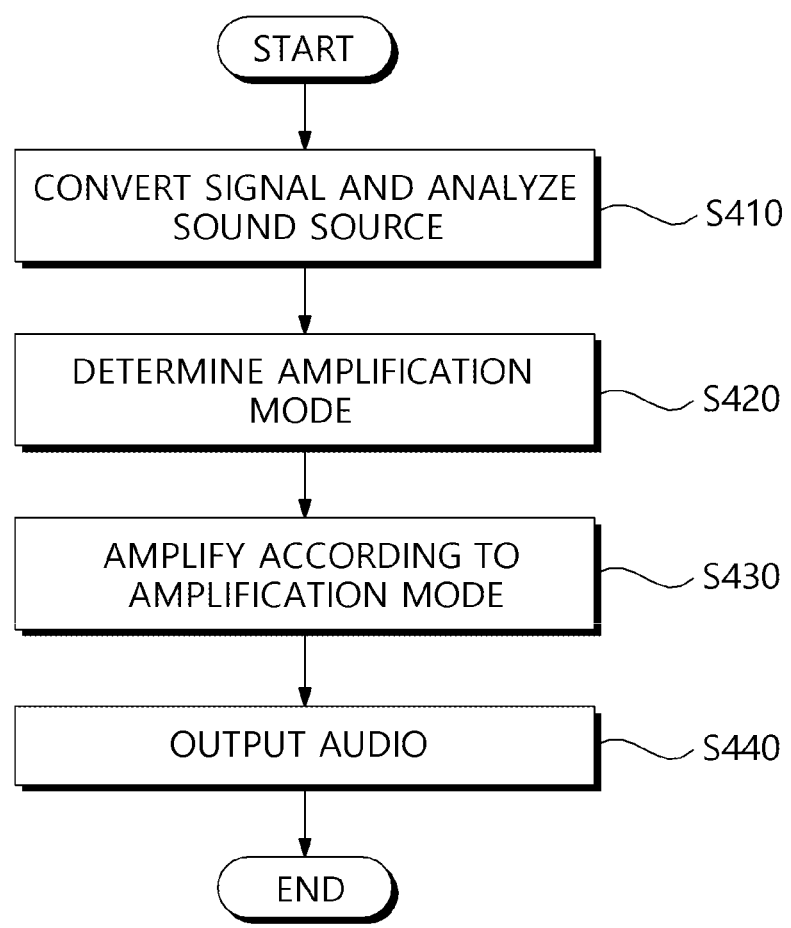
FIG. 4 is a flowchart for explaining a hybrid mode based audio processing method according to an exemplary embodiment of the present disclosure.

FIG. 4 is a flowchart for explaining a hybrid mode based audio processing method according to an exemplary embodiment of the present disclosure.

The audio processing apparatus 100 converts a digital signal of the input sound source into an analog signal and analyzes the input sound source in step S410.

The audio processing apparatus 100 sets an amplification mode according to an analysis result of the input sound source in step S420. The audio processing apparatus 100 sets one of a first amplification mode, a second amplification mode, and a hybrid amplification mode based on the analysis result on the input sound source. Here, the first amplification mode refers to a tube amp based amplification mode and the second amplification mode refers to an op-amp based amplification mode. Further, the hybrid amplification mode refers to an amplification mode in which the first amplification mode and the second amplification mode are mixed.

The audio processing apparatus 100 amplifies the analog signal according to the set amplification mode to generate a final amplified signal in step S430.

When the set amplification mode is the first amplification mode, the audio processing apparatus 100 generates a final amplified signal using only the first amplified signal acquired by the switching control according to the amplification control signal.

In the meantime, when the set amplification mode is the second amplification mode, the audio processing apparatus 100 generates a final amplified signal using only the second amplified signal acquired by the switching control according to the amplification control signal.

In the meantime, when the set amplification mode is the hybrid amplification mode, the audio processing apparatus 100 generates a final amplified signal using the first amplified signal and the second amplified signal acquired by the switching control according to the amplification control signal.

The audio processing apparatus 100 outputs an audio corresponding to the analog signal amplified based on the set amplification mode.

Even though in FIG. 4, it is described that the steps are sequentially performed, the present invention is not necessarily limited thereto. In other words, the steps illustrated in FIG. 4 may be changed or one or more steps may be performed in parallel so that FIG. 4 is not limited to a time-series order.

The hybrid mode based audio processing method according to the exemplary embodiment described in FIG. 4 may be implemented by an application (or a program) and may be recorded in a terminal (or computer) readable recording media. The recording medium which has the application (or program) for implementing the hybrid mode based audio processing method according to the exemplary embodiment recorded therein and is readable by the terminal device (or a computer) includes all kinds of recording devices or media in which computing system readable data is stored.

Figure 5:
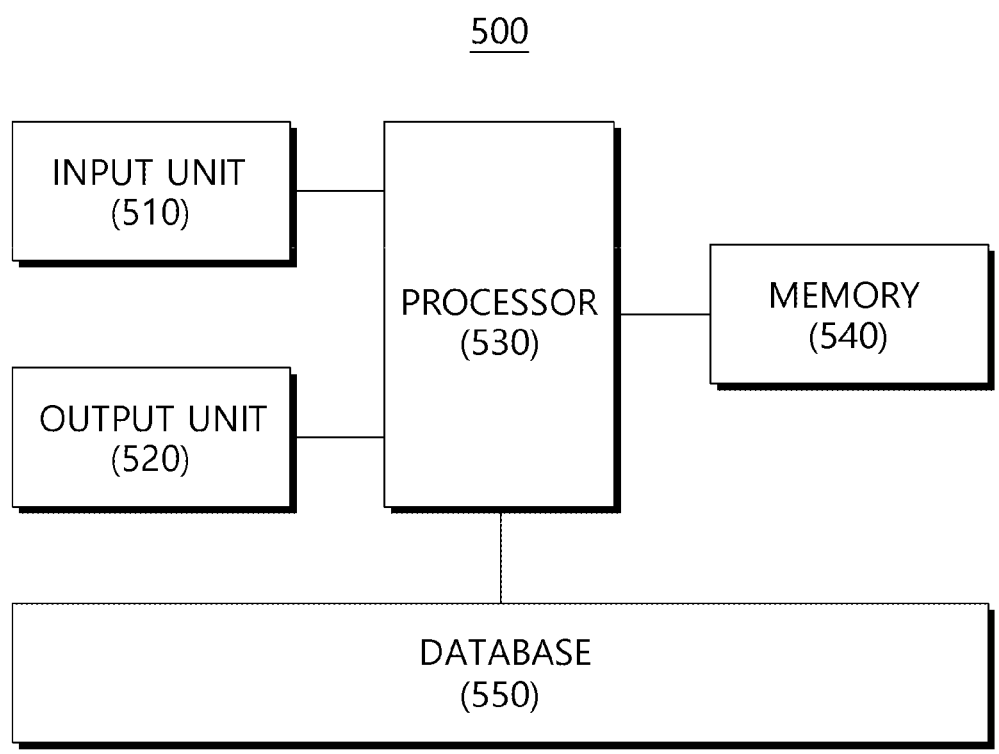
FIG. 5 is a block diagram schematically illustrating a hardware configuration of an audio processing apparatus according to an exemplary embodiment of the present disclosure.

FIG. 5 is a block diagram schematically illustrating a hardware configuration of an audio processing apparatus according to an exemplary embodiment of the present disclosure.

The amplification mode setting apparatus 500 according to the exemplary embodiment includes an input unit 510, an output unit 520, a processor 530, a memory 540, and a database 550. The amplification mode setting apparatus 500 of FIG. 5 is an example so that all blocks illustrated in FIG. 5 are not essential components and in the other exemplary embodiment, some blocks included in the amplification mode setting apparatus 500 may be added, modified, or omitted. In the meantime, the amplification mode setting apparatus 500 may be implemented by a computing device and each component included in the amplification mode setting apparatus 500 may be implemented by a separate software device or a separate hardware device in which the software is combined.

The amplification mode setting apparatus 500 performs an operation of analyzing an input sound source and setting an amplification mode according to the analysis result. Further, the amplification mode setting apparatus 500 generates an amplification control signal to control an amplifying module equipped independently according to the set amplification mode.

The input unit 510 refers to a unit which inputs or acquires a signal or data for analyzing a sound source and setting an amplification mode of the amplification mode setting apparatus 500. The input unit 510 interworks with the processor 530 and inputs various types of signals or data or directly acquires data by interworking with an external device to transmit the signal or data to the processor 530. Here, the input unit 510 may be implemented as a data receiver such as a sound source acquiring unit, but is not necessarily limited thereto and may be implemented as a microphone for inputting an external sound source or a sound.

The output unit 520 interworks with the processor 530 to output various information such as a sound source analysis result, a set amplification mode, and output audio information. The output unit 520 may desirably display various information through a display (not illustrated) equipped in the amplification mode setting apparatus 500, but is not necessarily limited thereto.

The processor 530 performs a function of executing at least one instruction or program included in the memory 540.

The processor 530 according to the exemplary embodiment analyzes an input sound source acquired from the input unit 510 or a database 550 and performs an operation of setting an amplification mode according to the analysis result.

Specifically, the processor 530 sets one of a first amplification mode, a second amplification mode, and a hybrid amplification mode based on the analysis result on the input sound source. Here, the first amplification mode refers to a tube amp based amplification mode and the second amplification mode refers to an op-amp based amplification mode. Further, the hybrid amplification mode refers to an amplification mode in which the first amplification mode and the second amplification mode are mixed.

Further, the processor 530 generates an amplification control signal to control an amplifying module equipped independently according to the set amplification mode.

The processor 530 according to the exemplary embodiment simultaneously performs an operation of setting an amplification mode and an operation of generating an amplification control signal, but is not necessarily limited thereto and may be implemented by a separate software or a separate hardware which performs the individual operations.

The memory 540 includes at least one instruction or program which is executable by the processor 530. The memory 540 may include an instruction or a program for an operation of analyzing a sound source, an operation of setting an amplification mode, and an operation of generating an amplification control signal.

The database 550 refers to a general data structure implemented in a storage space (a hard disk or a memory) of a computer system using a database management program (DBMS) and means a data storage format which freely searches (extracts), deletes, edits, or adds data. The database 550 may be implemented according to the object of the exemplary embodiment of the present disclosure using a relational database management system (RDBMS) such as Oracle, Informix, Sybase, or DB2, an object oriented database management system (OODBMS) such as Gemston, Orion, or O2, and XML native database such as Excelon, Tamino, Sekaiju and has an appropriate field or elements to achieve its own function.

The database 550 according to the exemplary embodiment stores a sound source and data related to the amplification mode and provides data related to the operation of setting an amplification mode and the operation of generating an amplification control signal. Here, even though it is described that the database 550 is implemented in the amplification mode setting apparatus 500, it is not limited thereto and may be implemented as a separate data storage device or a cloud.

It will be appreciated that various exemplary embodiments of the present disclosure have been described herein for purposes of illustration, and that various modifications and changes may be made by those skilled in the art without departing from the scope and spirit of the present invention. Accordingly, the exemplary embodiments of the present disclosure are not intended to limit but describe the technical spirit of the present invention and the scope of the technical spirit of the present invention is not restricted by the exemplary embodiments. The protective scope of the exemplary embodiment of the present invention should be construed based on the following claims, and all the technical concepts in the equivalent scope thereof should be construed as falling within the scope of the exemplary embodiment of the present invention.

What is claimed is:

1. A hybrid mode based audio processing apparatus, comprising:
   a signal converting unit which converts a digital signal of an input sound source into an analog signal;
   a mode control unit which analyzes the input sound source, sets an amplification mode according to the analysis result, and generates an amplification control signal to control the amplification mode;
   an amplifying unit which amplifies the analog signal in the amplification mode based on the amplification control signal; and
   an audio output unit which outputs an audio corresponding to the amplified analog signal,
   wherein the mode control unit sets any one of a first amplification mode, a second amplification mode, and a hybrid amplification mode based on the analysis result on the input sound source, and
   wherein the first amplification mode is a tube amp based mode, the second amplification mode is an op-amp based mode, and the hybrid amplification mode is a mixed mode of the first amplification mode and the second amplification mode.

2. The hybrid mode based audio processing apparatus according to claim 1, wherein the mode control unit sets an amplification mode corresponding to the analysis result of a type of the input sound source or a specific sound source which is set in advance by a user.

3. The hybrid mode based audio processing apparatus according to claim 1, wherein when the hybrid amplification mode is set, the mode control unit sets a ratio between the first amplification mode and the second amplification mode and generates the amplification control signal to control the amplification mode according to the set ratio.

4. The hybrid mode based audio processing apparatus according to claim 3, wherein the mode control unit generates the amplification control signal to control a power according to the ratio between the first amplification mode and the second amplification mode.

5. The hybrid mode based audio processing apparatus according to claim 1, wherein the amplifying unit includes:
   a first mode amplifying unit which amplifies the analog signal in a tube amp based first amplification mode based on the amplification control signal to output a first amplified signal;
   a second mode amplifying unit which amplifies the analog signal in an op-amp based second amplification mode based on the amplification control signal to output a second amplified signal; and
   a mode applying unit which generates and outputs a final amplified signal using at least one of the first amplified signal and the second amplified signal.

6. The hybrid mode based audio processing apparatus according to claim 5, wherein the first mode amplifying unit includes:
   a first mute cell which mutes the analog signal at a predetermined timing;
   a first audio block which amplifies the muted analog signal in the tube amp based first amplification mode; and
   a second mute cell which mutes the amplified analog signal at a predetermined timing.

7. The hybrid mode based audio processing apparatus according to claim 5, wherein the second mode amplifying unit includes:
   a third mute cell which mutes the analog signal at a predetermined timing;
   a second audio block which amplifies the muted analog signal in the op-amp based second amplification mode; and
   a fourth mute cell which mutes the amplified analog signal at a predetermined timing.

8. The hybrid mode based audio processing apparatus according to claim 5, wherein when the set amplification mode is the first amplification mode, the mode applying unit generates a final amplified signal using only the first amplified signal acquired by the switching control according to the amplification control signal.

9. The hybrid mode based audio processing apparatus according to claim 5, wherein when the set amplification mode is the second amplification mode, the mode applying unit generates a final amplified signal using only the second amplified signal acquired by the switching control according to the amplification control signal.

10. The hybrid mode based audio processing apparatus according to claim 5, wherein when the set amplification mode is the hybrid amplification mode, the mode applying unit generates a final amplified signal using the first amplified signal and the second amplified signal acquired by the switching control according to the amplification control signal.

11. A method for processing an audio based on a hybrid mode in an audio processing apparatus, the method comprising:
   a signal converting step of converting a digital signal of an input sound source into an analog signal;
   a mode control step of analyzing the input sound source, setting an amplification mode according to the analysis result, and generating an amplification control signal to control the amplification mode;
   an amplifying step of amplifying the analog signal in the amplification mode based on the amplification control signal; and
   an audio output step of outputting the amplified analog signal,
   wherein the mode control step sets any one of a first amplification mode, a second amplification mode, and a hybrid amplification mode based on the analysis result on the input sound source, and
   wherein the first amplification mode is a tube amp based mode, the second amplification mode is an op-amp based mode, and the hybrid amplification mode is a mixed mode of the first amplification mode and the second amplification mode.

* * * * *